United States Patent [19]

Rocci, Jr.

[11] 4,394,615

[45] Jul. 19, 1983

[54] APPARATUS FOR TESTING THE QUALITY OF THE GROUND CONNECTION AND THE INSULATION QUALITY IN AN ELECTRICAL HAND TOOL OR THE LIKE

[76] Inventor: Joseph A. Rocci, Jr., 12243 S. 71st Ave., Palos Heights, Ill. 60463

[21] Appl. No.: 128,499

[22] Filed: Mar. 10, 1980

[51] Int. Cl.³ .................... G01R 31/02; G01R 31/12
[52] U.S. Cl. .......................................... 324/51; 324/54
[58] Field of Search ............................. 324/51, 52, 54

[56] References Cited

U.S. PATENT DOCUMENTS

| | | | |
|---|---|---|---|
| 3,277,364 | 10/1966 | Abrahamson | 324/51 |
| 3,643,157 | 2/1972 | Ettelman | 324/51 |
| 3,798,540 | 3/1974 | Darden et al. | 324/51 |
| 3,837,844 | 9/1974 | Prugh | 324/51 |

*Primary Examiner*—Gerard R. Strecker
*Assistant Examiner*—Walter E. Snow
*Attorney, Agent, or Firm*—Barnes, Kisselle, Raisch, Choate, Whittemore & Hulbert

[57] ABSTRACT

Portable apparatus for testing the quality of a ground connection between the ground prong of a tool plug and the tool housing, and for testing the quality of insulation between the tool plug power prongs and the tool housing. The apparatus comprises an enclosure having a plug at one end adapted to be received into a conventional utility wall outlet and a receptacle at the other end for receiving a tool power plug. A pair of electrical contact plates are provided as two adjacent outside walls of the enclosure. Threshold detection circuitry carried internally of the housing is connected to the power and ground receptacles of the apparatus plug and to the contact plates. A first portion of the circuitry is effective for measuring the resistance between the ground prong of a tool plug inserted into the apparatus receptacle and a tool housing in physical contact with one of the contact plates. A second portion of the circuitry is effective for simultaneously measuring the resistance between the tool plug power prongs and the tool housing. LED's are connected to the measuring circuitry and observable by a user for indicating safe or unsafe ground or insulation quality.

4 Claims, 4 Drawing Figures

APPARATUS FOR TESTING THE QUALITY OF THE GROUND CONNECTION AND THE INSULATION QUALITY IN AN ELECTRICAL HAND TOOL OR THE LIKE

The present invention relates to electrical measuring and testing apparatus, and more particularly to apparatus for testing the quality of a ground connection in an electrical appliance such as a hand tool between the power plug and the appliance housing, and/or testing the quality of insulation between the plug power input lines and the appliance housing.

In the following description and claims, by measuring or testing "the quality of a ground connection" is meant determination that the ground prong on an appliance power plug is in fact connected to the appliance housing, and more specifically measuring the resistance between the ground prong and appliance housing to determine that such resistance is equal to or less than a desired maximum resistance. Similarly, by measuring or testing "the quality of insulation" is meant determination that the plug power units are insulated or substantially insulated from the appliance housing, and more specifically measuring the resistance between the power inputs and the appliance housing to determine that such resistance is equal to or greater than a desired minimum resistance.

Objects of the present invention are to provide test apparatus of the described type which is sufficiently compact to be carried in an operator's toolbox or pocket, which comprises a one-piece assembly not requiring extensible leads or probes which may become lost or damaged, which is economical in assembly yet rugged and durable in the field, and which may be used by unskilled operators.

The invention, together with additional objects, features and advantages thereof, will be best understood from the following description, the appended claims and the accompanying drawings in which:

Figure 1:
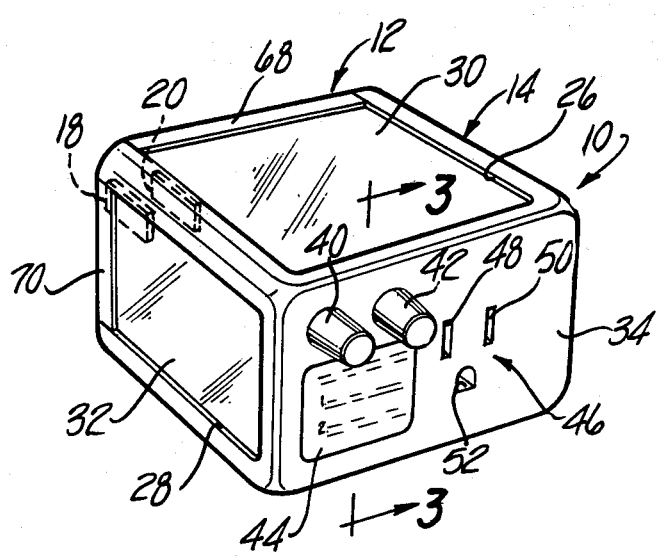
FIG. 1 is a perspective view of a presently preferred embodiment of the invention.
Figure 3:
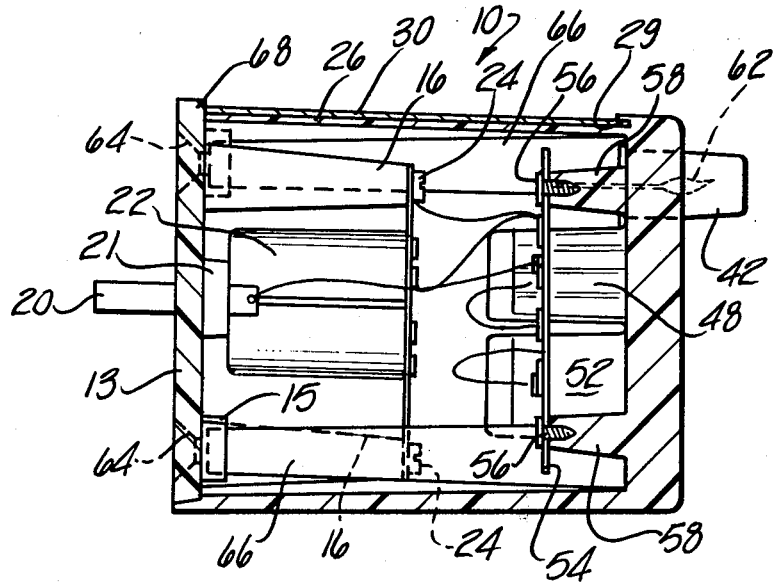
FIG. 3 is a sectional view taken substantially along the line 3—3 in FIG. 1.
Figure 2:
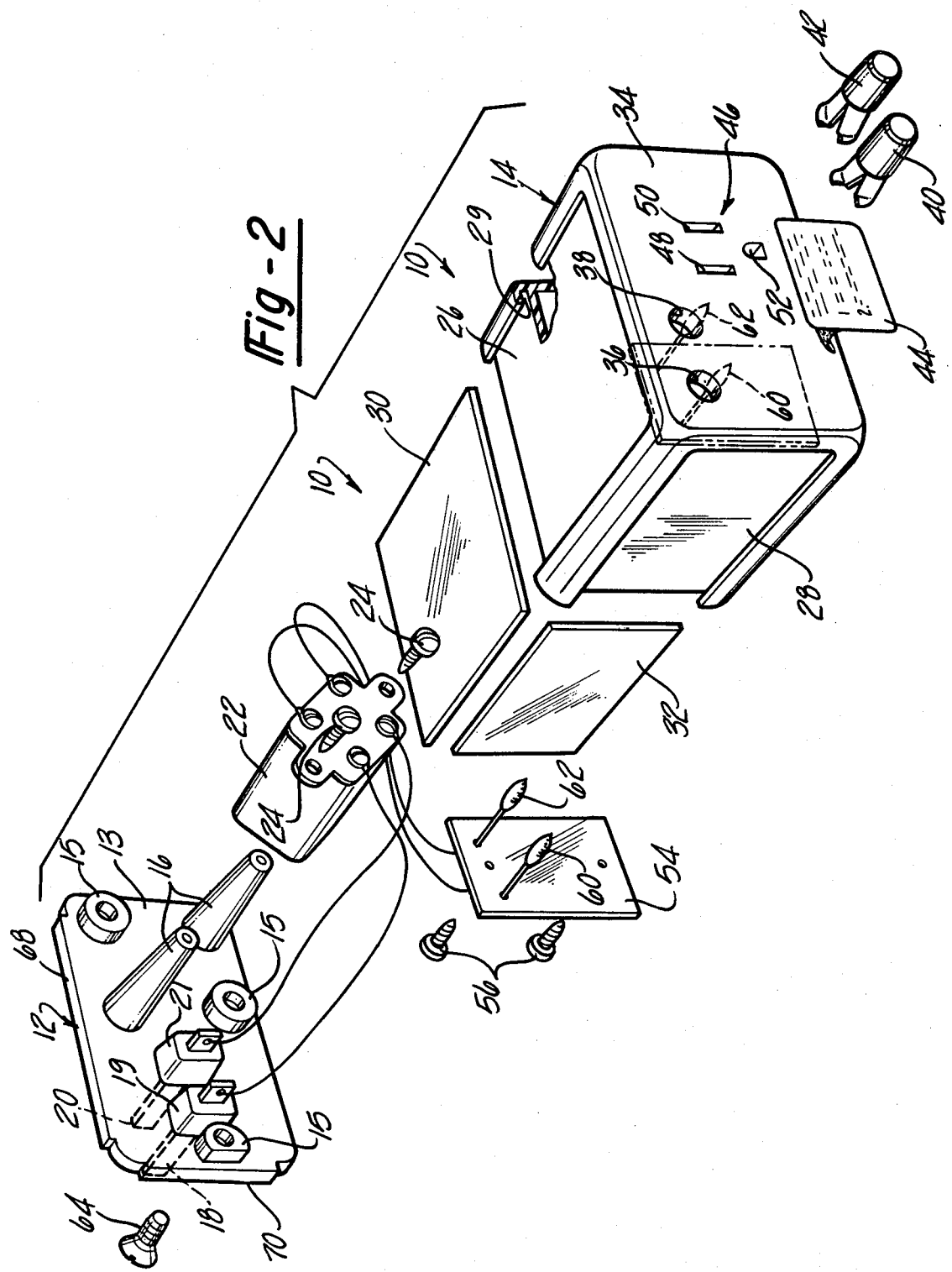
FIG. 2 is an exploded perspective view of the embodiment of the invention illustrated in FIG. 1.

Referring to FIGS. 1-3, a presently preferred embodiment of the invention is illustrated therein as comprising a hollow rectangular enclosure 10 having separable base and cap portions 12,14. Base 12 is preferably of molded plastic material such as ABS and comprise a rectangular generally flat wall 13 having the apertured bosses 15 and a pair of elongated posts 16 upstanding therefrom. A pair of parallel blade-like power prongs 18,20 are molded or pressed into corresponding bosses 19,21 upstanding from wall 13 and extend outwardly therefrom so as to be adapted to be received into the hot and neutral receptacles of a conventional two- or three-receptacle single phase 120 VAC utility outlet. A stepdown transformer 22 is mounted by the self-tapping screws 24 between the bosses 16.

Cap 14 generally comprises an open-ended rectangular enclosure of molded plastic material such as ABS. As best seen in FIG. 2, two adjacent side walls 26,28 of cap 14 are recessed. Each recessed wall 26,28 is bounded on three sides by the adjacent corners or edges of cap 14, each edge being slotted in the plane of the adjacent recessed wall as shown at 29. A pair of rectangular plates 30,32 of conductive material, preferably metal, are slidably received over corresponding recessed walls 26,28, with three contiguous edges of each respective plate being received in the corresponding slots 29. The end face or wall 34 of cap 14 has a pair of openings 36,38 respectively adapted to receive by snap-fit the lens caps 40,42. For convenience, caps 40,42 may be differently colored, preferably green and red respectively. Additionally, a self-adhesive label 44 is placed on end wall 34 beneath caps 40,42 so as to assist an operator in utilizing the invention in the manner to be described.

End wall 34 also includes a standard three-receptacle utility outlet 46. Outlet 46 comprises suitably apertured bosses molded into cap 14 into which are pressed conventional blade receptacles 48,50 adapted to receive hot and neutral power prongs on an appliance plug and a ground receptacle 52 adapted to receive the plug ground prong. A circuit board assembly 54 is mounted between spaced posts 58 (FIG. 3) extending integrally inwardly from cap end wall 34 by the self-tapping screws 56 received into corresponding post end openings. A pair of LED's 60,62 are mounted to and project upwardly from circuit board assembly 54 into cap openings 36,38 so as to illuminate respective lens caps 40,42. The remaining components on circuit assembly 54 will be described in detail in connection with FIG. 4.

Base 12 is secured over the open end of cap 14 by the self-tapping screws 64 (FIGS. 2 and 3) which extend through openings in bosses 15 into corresponding elongated posts 66 (FIG. 3) which project integrally inwardly from cap end wall 34. In this assembled condition, metal plates 30,32 are captured within corresponding wall recesses 26,28 by the ledges 68,70 radiating outwardly from adjacent edges of base wall 13. This assembled arrangement is illustrated in FIG. 3 with reference to plate 30 and is identical for plate 32, although not shown specifically in the drawings.

Figure 4:
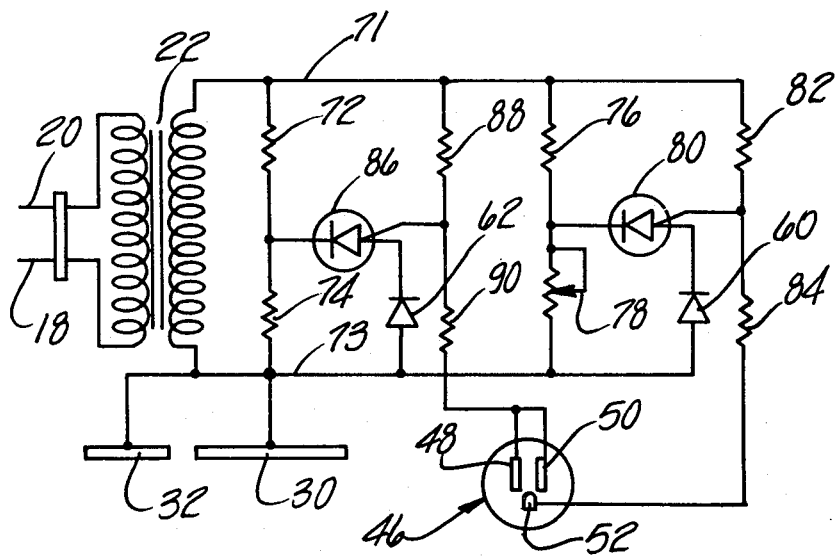
FIG. 4 is a schematical diagram of the electrical components of the embodiment of the invention illustrated in FIGS. 1-3.

FIG. 4 illustrates the preferred interconnection of electronic components in accordance with the invention, including those carried by circuit board assembly 54. The primary (120 VAC) winding of transformer 22 is connected across the power prongs 18,20 extending from base 12 so as to be received into a utility wall outlet or the like. The terminals of the secondary (6.3 VAC) winding of transformer 22 defined a pair of power busses 71,73 for the apparatus electronics. Connected across busses 71,73 is a first voltage divider consisting of the series-connected resistors 72,74, and a second voltage divider consisting of a resistor 76 and a series-connected adjustable resistor 78. A first programmable unijunction transistor (PUT) 80 has its cathode connected to the junction of resistors 76,78 and its anode connected to bus 73 through the cathode-anode of LED 60. The gate of PUT 80 is connected to bus 71 through a resistor 82 and to ground receptacle 52 of plug 46 through a resistor 84. A second PUT has its cathode connected to the junction of resistors 72,74 and its anode connected to bus 73 through the cathode-anode of LED 62. The gate of PUT 86 is connected to bus 71 through a resistor 88 and to both the power receptacles 48,50 of plug 46 through a resistor 90. Bus 73 is also connected to plates 30,32.

In operation for testing the insulation and ground qualities of an electrical hand tool, apparatus 10 is plugged into a utility wall outlet or the like and the tool under test is plugged into apparatus outlet 46. The metal housing of the tool is then brought by an operator into physical (and electrical) contact with one of the plates 30,32 and the tool on-off switch is depressed. PUT 80 then effectively measures the resistance between the tool plug ground prong received in receptacle 52 and the tool housing in contact with plate 30 or 32 by comparing such resistance with a preselected reference or threshold value determined by voltage divider 76,78. Resistor 78 is preferably factory adjusted so as to select a maximum safe resistance threshold between the tool ground prong and tool housing, preferably 1.25 ohms. If the resistance between the tool ground prong and the tool housing is equal to or less than the preselected maximum, PUT 80 will turn on and LED 60 will be illuminated for user observation. Thus, if LED 60 is illuminated, the tool housing is safely grounded, while if LED 60 remains unlit, the tool may be considered unsafe.

In a similar manner and simultaneously with the above-described ground test, with the tool in physical (and electrical) contact with one of the plates 30,32 and the tool on-off button depressed, PUT 86 effectively measures the quality of insulation between the tool plug power prongs received in receptacles 48 and 50 and the tool housing in contact with plate 30 or 32 by comparing such resistance with a preselected minimum reference or threshold determined by voltage divider 72,74. If the insulation resistance is less than the threshold determined by resistors 72,74, preferably 30,000 ohms, PUT 86 will turn on and LED 62 will be illuminated for user observation. On the other hand, if the insulation resistance is equal to or greater than the selected threshold, PUT 86 and LED 62 will remain off. Thus, the quality of the ground connection between the ground prong on the tool plug and the tool housing, as well as the quality of insulation between the plug power prongs and the tool housing, may be rapidly determined simultaneously in a one-step operation by merely depressing the tool on-off switch while holding the tool housing in physical contact with one of the plates 30,32.

From the foregoing description, it will be appreciated that the apparatus 10 provided by the invention is both compact and easy to operate. A particular advantage of the invention lies in the provision of tool-engaging contact means as an integral part of the apparatus housing rather than as one or more separate extensible leads which may become misplaced or damaged. The contact plates are provided on two adjacent walls of the enclosure so as to facilitate access thereto independently of the orientation of the enclosure when plugged into a wall outlet.

Another important advantage of the invention lies in the automatic provision of ground and insulation tests simultaneously and without any requirement for test switches or the like on the enclosure. Additionally, the apparatus may be readily used to determine the quality of ground connection and insulation as hereinabove described on larger appliances such as machine tools, etc. by plugging the apparatus into an extension cord and then bridging the apparatus into physical contact with the appliance housing. It is also envisioned within the broadest aspects of the invention that the apparatus may be battery-operated, which would be particularly beneficial for testing larger appliances since no extension cord would be required.

The invention claimed is:

1. Apparatus for testing the quality of a ground connection between the plug of an electrical hand tool or the like and the tool housing, said apparatus comprising
   a rectangular enclosure of molded plastic non-conductive construction and having a flat plate of conductive metallic construction secured to said enclosure as a first flat external wall of said rectangular enclosure,
   an electrical plug including at least first and second prongs rigidly carried by and projecting outwardly from a second wall of said enclosure other than said first wall and adapted to be received into first and second power receptacles of a utility power outlet,
   a three-receptacle electrical outlet carried by a third wall of said enclosure other than said first and second walls and adapted to receive a said tool plug having three prongs, with one of said three prongs being a tool ground prong and one of said three receptacles being a ground receptacle for receiving said tool ground prong,
   first electrical circuit means disposed within said enclosure and connected to said first and second prongs for receiving electrical power and to said ground receptacle and said plate, said first circuit means being responsive to electrical resistance between a tool housing in physical contact with said plate and the ground prong of a tool plug received in said three-receptacle outlet,
   said first circuit means, said enclosure including said plate and said three-receptacle outlet being electrically isolated from utility ground at said utility power outlet,
   second circuit means disposed within said enclosure and connected to said first and second prongs for receiving electrical power, to said plate and to both receptacles in said three-receptacle outlet other than said ground receptacle, said second circuit means being responsive to electrical resistance between a tool housing in physical contact with said plate and prongs of a tool plug other than the ground prong,
   first indicating means visibly disposed on said enclosure and responsive to said first circuit means for indicating the quality of a ground connection within a said tool between the tool plug and the tool housing, and
   second indicating means separate from said first indicating means visibly disposed on said enclosure and responsive to said second circuit means for indicating the quality of insulation within the tool between the said other prongs and the tool housing,
   said first and second circuit means being connected to said prongs, said plate and said receptacles in said three-receptacle outlet to operate independently of each other for indicating the quality of said ground connection and the quality of said insulation independently of each other.

2. The apparatus set forth in claim 1 wherein said second and third walls comprise axially opposite end walls of said enclosure.

3. The apparatus set forth in claim 2 further comprising a second flat plate of conductive metallic construction secured to said enclosure as a fourth flat external wall of said rectangular enclosure contiguous with said first wall and electrically connected to said first circuit means in parallel with said first plate.

4. The apparatus set forth in claim 3 wherein said enclosure comprises a flat base forming said second wall and carrying said first and second prongs, and an open hollow rectangular cap secured to said base, said first and fourth walls comprising adjacent recessed side walls on said cap bounded by opposing slots, said metal plates being received in said slots and retained in said slots over said recessed side walls by an opposing edge of said base.

* * * * *